United States Patent
Kikuchi et al.

(10) Patent No.: US 8,753,529 B2
(45) Date of Patent: Jun. 17, 2014

(54) CLATHRATE COMPOUND, THERMOELECTRIC MATERIAL, AND METHOD FOR PRODUCING THERMOELECTRIC MATERIAL

(71) Applicant: Furukawa Electric Co., Ltd., Tokyo (JP)

(72) Inventors: Daisuke Kikuchi, Tokyo (JP); Tatsuhiko Eguchi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/735,613

(22) Filed: Jan. 7, 2013

(65) Prior Publication Data

US 2013/0119295 A1  May 16, 2013

Related U.S. Application Data (63) Continuation of application No. PCT/JP2011/065575, filed on Jul. 7, 2011.

(30) Foreign Application Priority Data

Jul. 8, 2010 (JP) ................. 2010-155353
Mar. 28, 2011 (JP) ................. 2011-069472
Mar. 28, 2011 (JP) ................. 2011-069475

(51) Int. Cl.
*H01L 23/495* (2006.01)
*C25D 7/00* (2006.01)
*C25D 5/10* (2006.01)

(52) U.S. Cl.
USPC ........ 252/62.3 T; 423/324; 136/239; 136/237

(58) Field of Classification Search
USPC ............... 252/62.3 T; 136/239, 237; 423/324
See application file for complete search history.

(56) References Cited

U.S. PATENT DOCUMENTS 6,797,199 B2 *  9/2004  Eguchi et al. ................. 252/503

FOREIGN PATENT DOCUMENTS

| JP | 2004-67425 | * | 3/2004 |
| JP | 2009-40649 | * | 2/2009 |
| JP | 4413323 | | 11/2009 |

OTHER PUBLICATIONS

Translation for JP 2004-67425, Mar. 4, 2004.*
Translation of the specification for JP 2009-40649, Feb. 28, 2009.*
International Search Report issued on Oct. 11, 2011 for PCT/JP2011/065575 filed on Jul. 7, 2011 with English translation.
International Preliminary Report on Patentability issued Jan. 8, 2013 in PCT/JP2011/065575 filed Jul. 7, 2011 submitting English translation only.
International Preliminary Report on Patentability issued Feb. 12, 2013 in PCT/JP2011/065575 filed Jul. 7, 2011 submitting English translation only.
Written Opinion issued Oct. 11, 2011 in PCT/JP2011/065575 filed Jul. 7, 2011 with English language translation.

* cited by examiner

*Primary Examiner* — Carol M Koslow
(74) *Attorney, Agent, or Firm* — Oblon, Spivak, McClelland, Maier & Neustadt, L.L.P.

(57) ABSTRACT

Provided is a clathrate compound represented by a following chemical formula, for example, $Ba_aGa_bAl_cSi_d$

(where $7.77 \leq a \leq 8.16$, $7.47 \leq b \leq 15.21$, $0.28 \leq c \leq 6.92$, $30.35 \leq d \leq 32.80$, and $a+b+c+d=54$), and a thermoelectric material containing the clathrate compound. A producing method of the thermoelectric material is also provided.

5 Claims, 8 Drawing Sheets

CLATHRATE COMPOUND, THERMOELECTRIC MATERIAL, AND METHOD FOR PRODUCING THERMOELECTRIC MATERIAL

BACKGROUND

1. Field of the Invention

The present invention relates to a clathrate compound, a thermoelectric material using thereof and a method for producing the thermoelectric material.

2. Description of Related Art

A thermoelectric element using the Seebeck effect is capable of converting heat energy into electric energy. Such a thermoelectric element is now receiving attention as one of energy-saving technologies from the viewpoint of environmental issues because the element can convert exhaust heat from industrial/consumer processes and mobile units into an available electric power by utilizing the property.

A dimensionless figure of merit ZT of a thermoelectric element using the Seebeck effect is expressed by the following equation (1).

$$ZT = S^2 T / \rho \kappa \quad (1)$$

where S, $\rho$, $\kappa$ and T are the Seebeck coefficient, electrical resistivity, thermal conductivity and temperature, respectively.

It is apparent by the equation (1) that what is important to improve capacity of a thermoelectric element is to make the Seebeck coefficient of an element be large, an electrical resistivity be small and a thermal conductivity be small.

Conventionally, thermoelectric elements made of bismuth telluride, silicon germanium-based materials, lead telluride and the like are known as high-performance thermoelectric materials.

Each of these conventional thermoelectric elements has a problem to be solved. For example, the bismuth telluride have a high ZT value at a room temperature; however, the ZT value becomes small drastically at beyond 100 degrees C., and thus it is difficult to use the material as a thermoelectric material at 200-800 degrees C. which is necessary for generation of electric power from exhaust heat. On the other hand, the bismuth telluride and the lead telluride contain lead and/or tellurium that will cause environmental load.

Therefore, new thermoelectric materials which have sufficient thermoelectric property, cause less environmental load and have a light weight are requested to be developed. A clathrate compound is receiving attention as one of such new thermoelectric materials.

A composition and a method for producing a clathrate compound composed of Ba, Ga, Al and Si are already disclosed. Patent Document 1 discloses a single crystal and a producing method of $Ba_8(Al, Ga)_x Si_{46-x}$ in which silicon atoms are substituted by Al atoms or Ga atoms by the number of x ($10.8 \leq x \leq 12.2$) per unit lattice. Patent Document 2 discloses that a P-type Ba—Al—Si clathrate compound has a ZT of 1.01 at 700 degrees K.

However, these clathrate compounds have following problems.

The technique disclosed in Patent Document 1 (Tokukai 2004-67425A) does not disclose the ZT value and there is a concern for the property. Patent Document 2 (JP Patent No. 4413323, paragraph 0048, for example) discloses the p-type compound; however, a ZT value of an n-type compound is not disclosed and that may be a concern for the property.

A single-phase Si clathrate may be the best material for obtaining a high dimensionless figure of merit ZT. However, there is a problem that the single-phase Si clathrate for obtaining a high dimensionless figure of merit ZT generates a crack easily.

SUMMARY OF THE INVENTION

An object of the present invention is to provide a new clathrate compound for use for a thermoelectric element which is made of a low-cost material, contains no hazardous elements, has a ZT value of 0.2 or more at a temperature of 200-800 degrees C. and preferably has a ZT value of 0.4 or more at a high temperature region such as 800 degrees C. Also an object of the present invention is to provide a thermoelectric material that prevents an occurrence of a crack.

To solve a problem above explained, according to a first aspect of the invention, provided is a clathrate compound represented by a following chemical formula:

$$Ba_a Ga_b Al_c Si_d$$

(wherein $7.77 \leq a \leq 8.16$, $7.47 \leq b \leq 15.21$, $0.28 \leq c \leq 6.92$, $30.35 \leq d \leq 32.80$, and $a+b+c+d=54$).

According to a second aspect of the invention, provided is a thermoelectric material of an n-type that includes a clathrate compound represented by a following chemical formula:

$$Ba_a Ga_b Al_c Si_d$$

(wherein $7.77 \leq a \leq 8.16$, $7.47 \leq b \leq 15.21$, $0.28 \leq c \leq 6.92$, $30.35 \leq d \leq 32.80$, and $a+b+c+d=54$).

According to a third aspect of the invention, provided is a thermoelectric material that includes mainly a clathrate compound represented by a following chemical formula:

$$Ba_a Ga_b Al_c Si_d$$

(wherein $7.8 \leq a \leq 8.16$, $7.91 \leq b \leq 10.74$, $4.36 \leq c \leq 6.95$, $30.13 \leq d \leq 31.54$, and $a+b+c+d=54$), in which a "strongest peak ratio" defined by a following equation is less than 100%:

$$\text{"strongest peak ratio"} = IHS/(IHS+IA) \times 100(\%),$$

where "IHS" is a strongest peak of a Si clathrate phase by an X-Ray diffraction analysis and "IA" is a strongest peak of a second phase by the X-Ray diffraction analysis.

According to a fourth aspect of the invention, provided is a method for producing the thermoelectric material that includes a step of preparing a clathrate compound having a predetermined composition by mixing raw materials of Ba, Ga, Al and Si, melting the mixed raw materials and solidifying the melted raw materials, a step of grinding the clathrate compound into a fine powder, and a step of sintering the fine powder.

According to the present invention, a clathrate compound having an excellent thermoelectric property, a thermoelectric material using the clathrate compound and a producing method of the thermoelectric material can be provided.

Especially, the present invention can provide a new clathrate compound that can be used for an n-type thermoelectric element which contains no hazardous elements, is made of a low-cost material, has a ZT value of 0.2 or more at a temperature of 200-800 degrees C. and preferably has a ZT value of 0.4 or more at a high temperature region such as 800 degrees C. A thermoelectric material using the clathrate compound and a method for producing the thermoelectric material can be also provided.

According to a third aspect of the invention, occurrence of a crack can be prevented because the strongest peak ratio is less than 100% and a second phase is contained other than a Si clathrate phase.

DETAILED DESCRIPTION OF THE PREFERRED EMBODIMENTS

Preferred embodiments of the present invention will be explained hereafter.

First Embodiment

(A) Clathrate Compound and Thermoelectric Material

A clathrate compound according to a first embodiment of the present invention contains all of the Ba, Ga, Al and Si and is represented as $Ba_aGa_bAl_cSi_d$ (where $7.77 \leq a \leq 8.16$, $7.47 \leq b \leq 15.21$, $0.28 \leq c \leq 6.92$, $30.35 \leq d \leq 32.80$, and $a+b+c+d=54$). A thermoelectric material according to a first embodiment of the present invention is an n-type thermoelectric material containing the clathrate compound.

The clathrate compound according to a first embodiment is structured by a silicon clathrate framework as a basic framework, Ba atoms are held inside the framework structure and a part of atoms that structure the clathrate framework is substituted by Ga and Al atoms.

The clathrate compound according to a first embodiment contains a Si clathrate phase as a main component and may include other phase than a clathrate phase. Preferably, the clathrate compound of a first embodiment is composed of a single-phase of a Si clathrate.

A composition ratio b, c and d of the Ga, Al and Si atoms in the compound $Ba_aGa_bAl_cSi_d$ approximately satisfies the following relation.

$$b+c+d=46$$

When the relation is satisfied, the clathrate compound is composed of a Si clathrate phase as a main component and can have an ideal crystal structure.

The thermoelectric material of a first embodiment has a ZT value of 0.4 or more at the temperature of 800 degrees C.

The thermoelectric material of a first embodiment is composed of the above clathrate compound as a main component and may contain small amount of additives.

(B) Producing Method

A producing method of the thermoelectric material according to a preferred embodiment includes following steps.
(1) A preparation step for preparing a clathrate compound having a predetermined composition by mixing Ba, Ga, Al and Si as raw materials, melting the mixed materials and solidifying the melted (molten) materials.
(2) A grinding step for grinding the clathrate compound into a fine powder.
(3) A sintering step for sintering the fine powder.

A thermoelectric material having a predetermined and uniform composition having small amount of pores can be obtained by the steps above explained.
(1) Preparation Step An ingot of a clathrate compound having a predetermined and uniform composition is prepared in the preparation step.

At first, predetermined amount of materials (Ba, Ga, Al and Si) are weighed and mixed to adjust a desired composition. The material may be an element, alloy or compound and may be a powder, flake or block (massive) in shape.

A mother alloy of Al—Si instead of an elemental Si is preferable for a raw material of Si because the Al—Si alloy causes a lower melting point.

It is necessary to keep enough time for mixing all of the materials as a melting time. However, it is preferable to make the melting time as short as possible from the viewpoint of energy consumption by the preparation. Therefore, the melting time is preferably 1 to 100 minutes, more preferably 1 to 10 minutes and further preferably 1 to 5 minutes.

A method to melt the mixed powder materials is not limited but various kinds of methods are available.

For example, heating by a resistance heating element, a high-frequency induction melting, arc melting, plasma melting or electron beam melting may be used as a melting method.

A graphite crucible, alumina crucible or cold crucible may be used in relation to the heating method.

The melting is preferably performed under inert gas atmosphere or vacuum atmosphere so as to prevent oxidation of the materials.

A mixture of fine powder materials is preferable to obtain uniformly mixed state within a short time. However, a massive Ba is preferable as a Ba material to prevent oxidation. It is preferable to stir mechanically or electromagnetically during the melting.

A die casting may be used to make an ingot. Or the molten material may be solidified in the crucible.

The ingot may be annealed to unify the composition after melting.

The annealing time may preferably be as short as possible to reduce energy consumption; however, it may take a long time to obtain a sufficient annealing effect. Preferably, the annealing time is 1 hour or more and more preferably the annealing time is 1 to 10 hours.

An annealing process temperature is preferably 700 to 950 degrees C. and more preferably 850 to 930 degrees C. When the annealing process temperature is below 700 degrees C., the homogenization becomes insufficient and when the process temperature becomes over 950 degrees C., segregation (unevenness of concentration) of the material occurs due to re-melting.

(2) Grinding Step

In the grinding step, the ingot prepared at the preparation step is ground with a ball mill or the like so as to obtain a fine powder clathrate compound.

A fine grain size is desirable to increase sintering characteristics. The grain diameter is preferably 150 micrometer or less and more preferably 1 micrometer or more to 75 micrometer or less in this embodiment.

The ingot is ground by such as a ball mill and then the grain size is adjusted. The adjustment is carried out by sieving, for example, using a test sieve based on ISO3310-1 standards supplied by Retsch and a sieve shaker AS200 digit supplied by Retsch.

It is possible to produce a fine powder by an atomizing method such as a gas-atomizing method or a flowing gas evaporation method instead of the grinding step.

(3) Sintering Step

The powder clathrate compound obtained at the grinding step is sintered to form a uniform solid body having less cavity and a predetermined shape at the sintering step.

A spark plasma sintering method, hot press sintering method, hot isostatic pressing sintering method, and the like can be used for the sintering method.

When using the spark plasma sintering method, a sintering temperature as a sintering condition is preferably 600 to 900 degrees C. and more preferably 800 to 900 degrees C. A sintering time is preferably 1 to 10 minutes and more preferably 3 to 7 minutes. A sintering pressure is preferably 40 to 80 MPa and more preferably 50 to 70 MPa.

When the sintering temperature is not more than 600 degrees C., the compound is not sintered and when the sintering temperature is 1000 degrees C. or more, the compound will melt. When the sintering time is shorter than 1 minute, the density becomes small and when the sintering time is 10 minutes or longer, the sintering process is completed and saturated and thus it has no meaning to take such a long sintering time.

At the sintering step the powder clathrate compound is heated up to the sintering temperature above explained, kept at the temperature during the sintering time and then cooled to the temperature before heating. Especially, the step to heat the powder clathrate compound up to the sintering temperature and the step to keep the compound at the temperature are maintained in a pressurized state. The pressurized state is released at the step to cool down the clathrate compound.

It becomes possible to prevent cracking of the powder clathrate compound at the sintering step by virtue of the pressure controlling above explained.

(C) Confirmation of Production of Clathrate Compound Phase

It can be confirmed, by a powder X-ray diffraction (XRD), whether or not a clathrate compound is produced by the producing method above explained.

Specifically, it can be confirmed, by the measurement of a crushed sample of the sintered compound using the powder X-ray diffraction, that a type-1 clathrate compound was produced in a case where an obtained peak shows only that of the type-1 clathrate phase (Pm-3n, No. 223).

However, the sintered compound is practically includes the type-1 clathrate phase without impurities and the type-1 clathrate phase containing impurities, and thus a peak by the impurities is also observed.

A strongest peak ratio of a Si clathrate compound phase of the clathrate compound of this embodiment is not less than 850, preferably not less than 90% and more preferably not less than 95%.

The strongest peak ratio of this embodiment is defined by a following equation (2-1) using a strongest peak (IHS) of a Si clathrate compound phase measured by the powder X-ray diffraction, a strongest peak intensity of an impurity phase A ($BaGa_{4-Y}(Al,Si)_Y$ ($0 \leq Y \leq 4$)) (IA) and a strongest peak intensity of an impurity phase B ($BaAl_2Si_2$, for example) (IB).

$$\text{Strongest peak ratio} = IHS/(IHS + IA + IB) \times 100 (\%) \quad (2-1)$$

(D) Characteristics Evaluation Test

Next, a characteristics evaluation for calculating the dimensionless figure of merit ZT of the thermoelectric material produced by the above method will be explained.

The items of the characteristics evaluation are the Seebeck coefficient S, electrical resistivity $\rho$ and thermal conductivity $\kappa$.

A composition analysis using an electron probe micro analyzer (Shimadzu corporation, EPMA-1610), microscopic structure observation and sintering density measurement are performed as the characteristics evaluation tests.

A sample for the characteristics evaluation tests is cut out from a cylindrical sintered material having a diameter of 20 mm and a height of 5 to 20 mm and shaped into a necessary form.

The Seebeck coefficient S and the electrical resistivity $\rho$ are measured by the four-probe method using a thermoelectric characteristics evaluation device (ZEM-3, ULVAC-RIKO, Inc.).

The thermal conductivity $\kappa$ is calculated by a following equation (3) using measured specific heat c, density $\delta$ and thermal diffusivity $\alpha$.

$$K = c\delta\alpha \quad (3)$$

The specific heat c is measured by the DSC (Differential Scanning calorimetry) method. A differential scanning calorimetry device supplied by SII NanoTechnology Inc. (EXSTAR6000DSC) may be used for the measurement.

The density $\delta$ is measured by the Archimedes' method. A precision electronic balance supplied by Shimadzu Corporation (LIBROR AEG-320) may be used for the measurement.

The thermal diffusivity $\alpha$ is measured by the laser flash method. A thermal constant measuring device supplied by ULVAC-RIKO, Inc. (TC-7000) may be used for the measurement.

The dimensionless figure of merit ZT, which is an index for evaluating the property of a thermoelectric material, can be calculated by the equation (1) with the measured values above explained. The characteristics of the thermoelectric material can be evaluated by the calculated dimensionless figure of merit.

According to the thermoelectric material of this embodiment, the ZT value at the temperature of 800 degrees C. is 0.4 or more.

Second Embodiment

A second embodiment differs from a first embodiment in following points.

(A) Clathrate Compound and Thermoelectric Material

A clathrate compound according to a second embodiment of the present invention contains all of the Ba, Ga, Al and Si and is represented as $Ba_aGa_bAl_cSi_d$ (where $7.8 \leq a \leq 8.16$, $7.91 \leq b \leq 10.74$, $4.3 \leq c \leq 6.95$, $30.13 \leq d \leq 31.54$, and $a+b+c+d=54$). A thermoelectric material according to a second embodiment of the present invention is an n-type thermoelectric material containing the clathrate compound.

The clathrate compound according to a second embodiment is structured by a silicon clathrate framework as a basic framework, Ba atoms are held inside the framework structure and a part of atoms that structure the clathrate framework is substituted by Ga and Al atoms.

The clathrate compound according to a second embodiment contains a Si clathrate phase as a main component and includes other phase (second phase or sub-phase) than the Si clathrate phase.

A composition ratio b, c and d of the Ga, Al and Si atoms in the compound $Ba_aGa_bAl_cSi_d$ approximately satisfies the following relation.

$$b+c+d=46$$

When the relation is satisfied, the clathrate compound is composed of a Si clathrate phase as a main component and can have an ideal crystal structure.

The thermoelectric material according to a second embodiment is structured by the clathrate compound as a main component and may contain small amount of additives.

(C) Confirmation of Production of Clathrate Compound Phase

As is the case with a first embodiment, it can be confirmed, by a powder X-ray diffraction (XRD), whether or not a clathrate compound is produced by the producing method above explained.

Specifically, it can be confirmed, by the measurement of a crushed sample of the sintered compound using the powder X-ray diffraction, that a type-1 clathrate compound was produced in a case where an obtained peak shows only that of the type-1 clathrate phase (Pm-3n, No. 223).

According to a second embodiment, a peak of a second phase may be observed in addition to the peak of the type-1 clathrate phase because the clathrate compound contains the second phase.

The strongest peak ratio of a Si clathrate compound phase of the clathrate compound of this embodiment is less than 100%, preferably 99% or less and more preferably from 96% to 99%.

The strongest peak ratio of this embodiment is defined by a following equation (2-2) using the strongest peak of a Si clathrate compound phase (IHS) measured by the powder X-ray diffraction and the strongest peak of the second phase A ($BaGa_{4-Y}(Al,Si)_Y$ ($0 \leq Y \leq 4$)) (IA).

$$\text{Strongest peak ratio} = IHS/(IHS+IA) \times 100(\%) \quad (2-2)$$

The meaning of that the strongest peak ratio of a Si clathrate compound phase is less than 100% is that the clathrate compound contains a second phase and that the second phase can be detected in the result of the X-ray diffraction.

Figure 2:
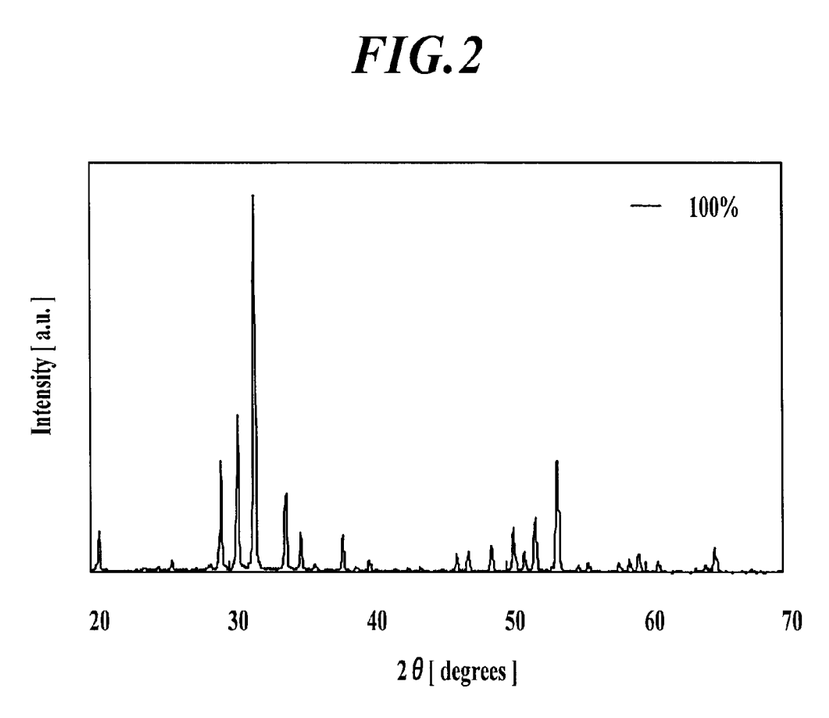
FIG. 2 is a schematic graph showing an X-ray diffraction result which a strongest peak ratio of a Si clathrate compound phase is 100%.
Figure 3:
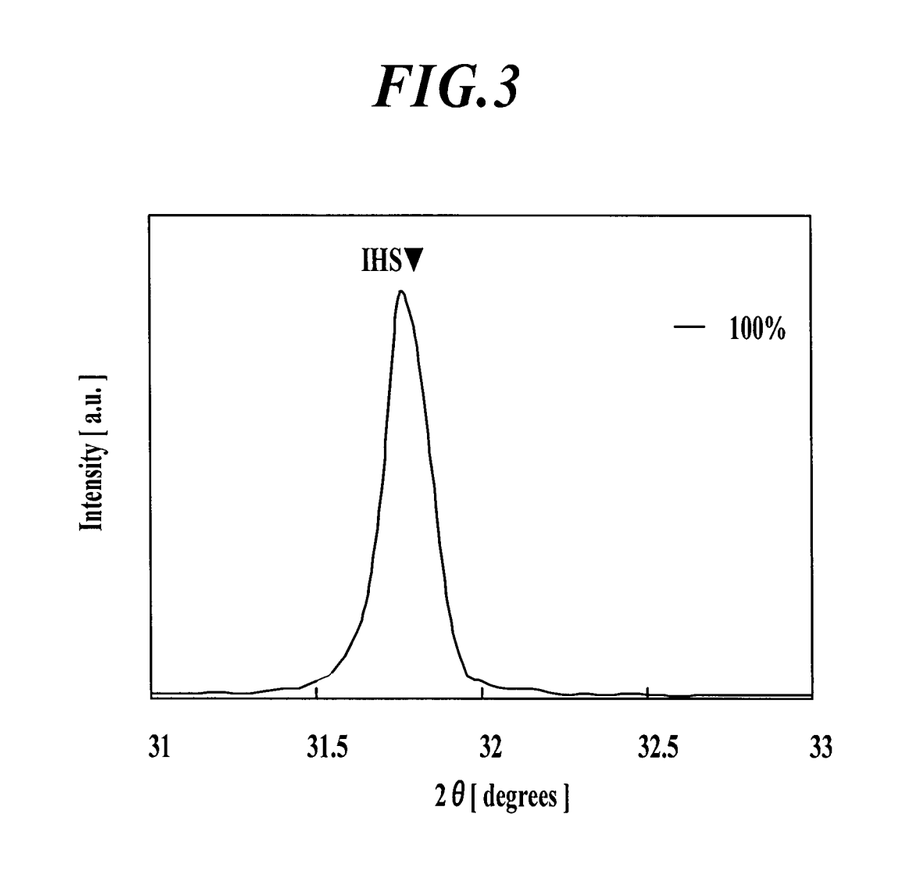
FIG. 3 is an enlarged drawing of a specific region ($2\theta=31$ to 33) of FIG. 2.

As can be seen by FIG. 2 and FIG. 3, when the strongest peak ratio of the Si clathrate compound phase is 100%, only the strongest peak (IHS) of the Si clathrate compound phase is observed in a range of $2\theta=31$ to 33 and the strongest peak (IA) of the second phase A cannot be observed.

Figure 4:
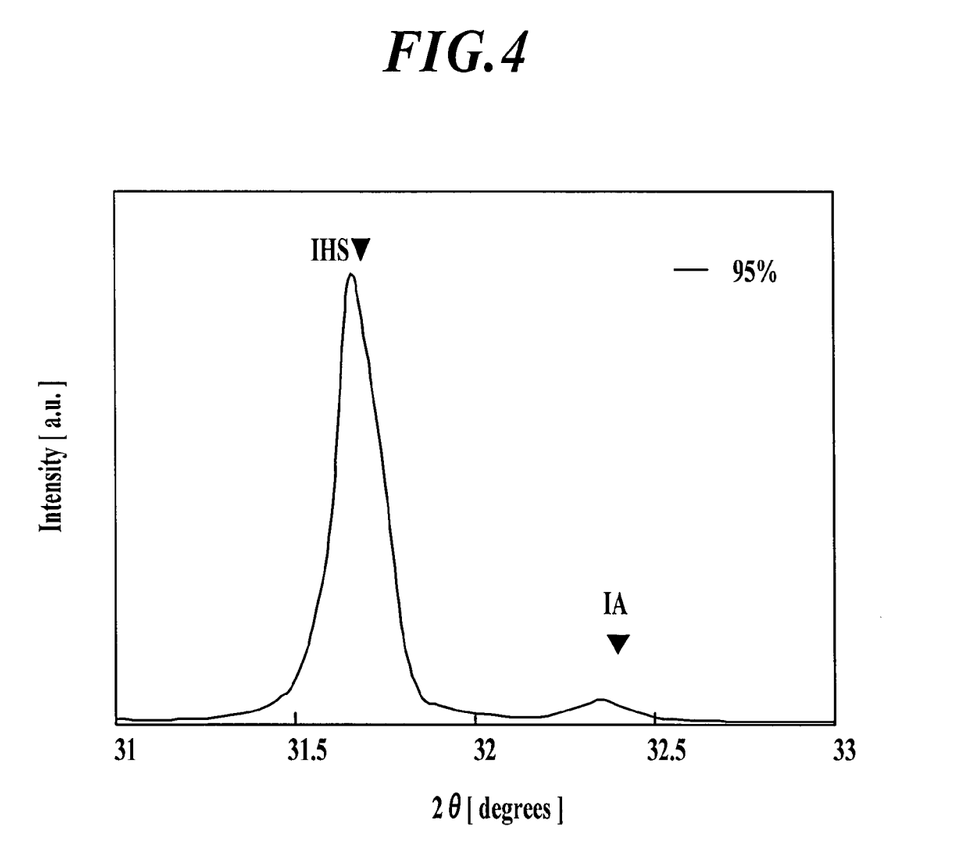
FIG. 4 is a schematic enlarged drawing of a specific region ($2\theta=31$ to 33) of an X-ray diffraction result which a strongest peak ratio of a Si clathrate compound phase is 95%.
Figure 5:
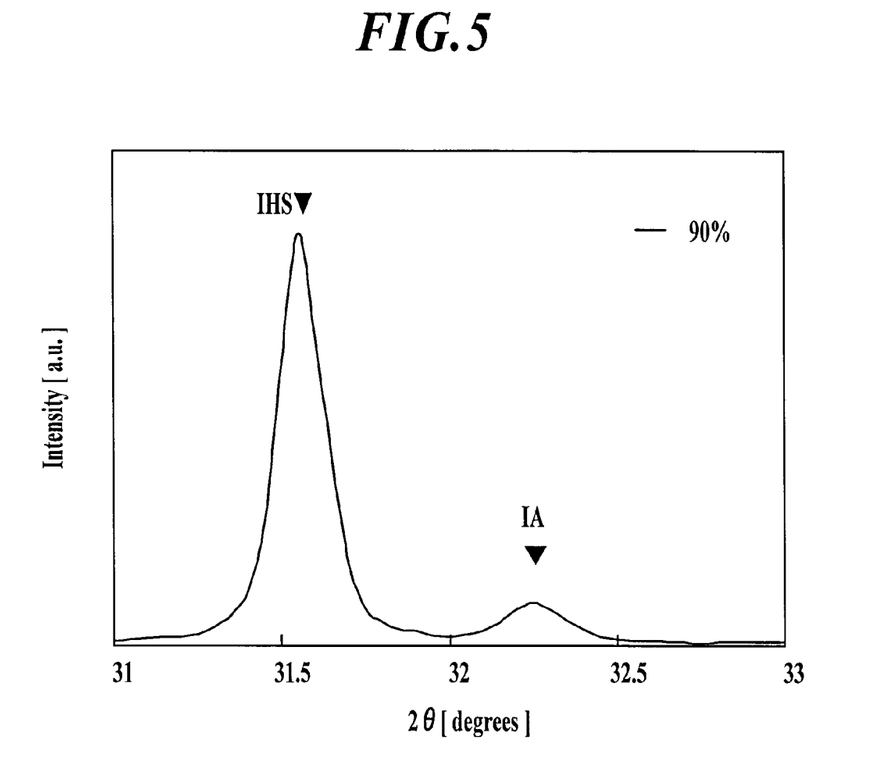
FIG. 5 is a schematic enlarged drawing of a specific region ($2\theta=31$ to 33) of an X-ray diffraction result which a strongest peak ratio of a Si clathrate compound phase is 90%.

On the other hand, in a case where the strongest peak ratio of a Si clathrate compound phase is 95% or 90%, as shown in FIGS. 4 and 5, the strongest peak (IHS) of the Si clathrate compound phase is observed in a range of $2\theta=31$ to 32 and the strongest peak (IA) of the second phase A can be observed in a range of $2\theta=32$ to 33.

What the strongest peak ratio of the Si clathrate compound phase is less than 100% can be said as that an X-ray diffraction result such as FIG. 4 or FIG. 5 can be obtained.

Third Embodiment

A third embodiment differs from a first embodiment in following points.
(A) Clathrate Compound and Thermoelectric Material A clathrate compound according to a third embodiment of the present invention contains all of the Ba, Ga, Al and Si and is represented as $Ba_zGa_{y-x}Al_xSi_{46-y}$ (where $7 \leq z \leq 8$, $15 \leq y \leq 17$, and $0 < x < y$). A thermoelectric material according to a third embodiment of the present invention is an n-type thermoelectric material containing the clathrate compound.

The clathrate compound according to a third embodiment is structured by a silicon clathrate framework as a basic framework, Ba atoms are held inside the framework structure and a part of atoms that structure the clathrate framework is substituted by Ga and Al atoms.

The clathrate compound according to a third embodiment contains a Si clathrate phase as a main component and may include other phase than a clathrate phase. Preferably, the clathrate compound of a third embodiment is composed of a single-phase of a Si clathrate.

A range of x in the chemical formula $Ba_zGa_{y-x}Al_xSi_{46-y}$ (where $7 \leq z \leq 8$, $15 \leq y \leq 17$, and $0 < x < y$) is $0 < x < y$ as shown above and preferably $4 \leq x \leq 10$ and more preferably $4 \leq x \leq 6$.

By adjusting the values of z and y within the above ranges, the clathrate compound can be structured by a Si clathrate phase as a main component. If the values of z and y were out of the ranges, a ratio of the other phase will increase and the ZT value becomes decreased. By adjusting the value of x within the above range, the clathrate compound contains the clathrate phase in higher ratio and obtains higher ZT value.

A thermoelectric material according to a third embodiment has a ZT value of 0.2 or more at the temperature range of 200 to 800 degrees C. and preferably 0.3 or more at 500 degrees C.

The thermoelectric material according to a third embodiment is structured by the above clathrate compound as a main component and may contain small amount of additives.

Fourth Embodiment

A fourth embodiment differs from a first embodiment in following points.
(A) Clathrate Compound and Thermoelectric Material A clathrate compound according to a fourth embodiment of the present invention contains all of the Ba, Ga, Al and Si and is represented as $Ba_zGa_{y-x}Al_xSi_{46-y}$ (where $7 \leq z \leq 8$, $15 \leq y \leq 17$, and $0 < x < y$). A thermoelectric material according to a fourth embodiment of the present invention is an n-type thermoelectric material containing the clathrate compound.

The clathrate compound according to a fourth embodiment is structured by a silicon clathrate framework as a basic framework, Ba atoms are held inside the framework structure and a part of atoms that structure the clathrate framework is substituted by Ga and Al atoms.

The clathrate compound according to a fourth embodiment contains a Si clathrate phase as a main component and may include other phase than a clathrate phase. Preferably, the clathrate compound of a fourth embodiment is composed of a single-phase of a Si clathrate.

A range of x in the chemical formula $Ba_zGa_{y-x}Al_xSi_{46-y}$ (where $7 \leq z \leq 8$, $15 \leq y \leq 17$, and $0 < x < y$) is $0 < x < y$ as shown above and preferably $4 \leq x \leq 10$ and more preferably $4 \leq x \leq 6$.

By adjusting the values of z and y within the above ranges, the clathrate compound can be structured by a Si clathrate phase as a main component. If the values of z and y were out of the ranges, a ratio of the other phase will increase and the ZT value becomes decreased. By adjusting the value of x within the above range, the clathrate compound contains the clathrate phase in higher ratio and obtains higher ZT value.

A thermoelectric material according to a fourth embodiment has a ZT value of 0.2 or more at the temperature range of 200 to 800 degrees C. and preferably 0.3 or more at 500 degrees C.

The thermoelectric material according to a fourth embodiment is structured by the above clathrate compound as a main component and may contain small amount of additives.

(B) Producing Method (1) Preparation Step

According to this embodiment, the melting temperature should be set to or more than a melting point of a material having the highest melting point among the materials contained in the raw mixture.

In a case where an elemental Si is contained as a raw material, for example, the melting temperature should be the melting point of Si (1414 degrees C.) or more. Nevertheless, although the melting temperature equal to or more than the highest melting point of the raw materials is necessary, the melting temperature is preferably as low as possible for saving energy consumption and preventing oxidation of the materials. Therefore, the melting temperature is, when an elemental Si is contained as a raw material, preferably not more than 1500 degrees C. and more preferably 1420 degrees C.

The present invention will be explained in details by way of examples 1 to 3; however, the present invention is not limited to the examples 1 to 3.

Basically, the example 1 shows an example of the compound explained in a first embodiment, the example 2 shows an example of the compound explained in a second embodiment and the example 3 shows an example of the compound explained in a third embodiment.

Example 1

(1) Sample Preparation

Raw materials mixture was prepared by weighing and mixing of high purity Ba which the degree of purity is 2N or more, high purity Al and Ga both of which the degree of purity is 3N or more and high purity Si which the degree of purity is 3N or more in a mixing ratio shown in Tables 1 and 2.

The raw materials mixture was melted by arc melting in one minute by passing a current of 300 A on a water-cooled copper hearth under Argon atmosphere and then the ingot was turned upside down and melted again by arc melting for unifying the materials. After repeating the process in five times, the molten materials mixture was cooled down to the room temperature on the water-cooled copper hearth to obtain an ingot containing clathrate compounds.

After that, the ingot was annealed in 6 hours at 900 degrees C. under Argon atmosphere so as to increase uniformity of the ingot.

The obtained ingot was ground using a planetary ball mill made of agate to obtain fine powder. A grain size of the powder was adjusted using a test sieve based on ISO3310-1 standards supplied by Retsch and a sieve shaker AS200 digit supplied by Retsch so as to make the average grain diameter in the range of 75 μm or small.

The obtained powder for sintering was sintered using a spark plasma sintering (SPS) method. That is, the powder was pressurized up to 60 MPa, heated up to 900 degrees C. and then sintered in five minutes at 900 degrees C. After sintering the pressure was released and cooled from 900 degrees C. to the room temperature.

When the sintered powder was cooled while keeping the pressurized atmosphere after sintering, a crack occurred. However, when the sintered powder was cooled from 900 degrees C. to the room temperature after releasing the pressure after sintering, the occurrence of a crack could be prevented. When the cooling temperature is not less than 500 degrees C., it is preferable that the sintered powder be held in a vacuum atmosphere from a viewpoint of degradation of the obtained sample and the die. However, when the cooling temperature is less than 500 degrees C., the sintered powder can be held in the air atmosphere.

The sintered body (sample) was analyzed for the composition and by the X-ray diffraction explained in the "(C) Confirmation of Production of Clathrate Compound" and tested as explained in the "(D) Characteristics Evaluation Test".

(2) Sample Evaluation (2.1) Composition Analysis

The results of the composition analysis are shown in Table 1 and Table 2.

As can be seen by Table 1, compounds having the desired composition of $Ba_aGa_bAl_cSi_d$ (where $7.77 \leq a \leq 8.16$, $7.47 \leq b \leq 15.21$, $0.28 \leq c \leq 0.92$, $30.35 \leq d \leq 32.80$, and $a+b+c+d=54$) were obtained by the examples 1-1 to 1-13.

(2.2) X-ray Diffraction Analysis

The obtained samples were analyzed by the powder X-ray diffraction.

The strongest peak ratios were calculated by the equation (2) based on the results of the powder X-ray diffraction.

The calculated results are shown in Table 1 and Table 2.

(2.3) Characteristics Evaluation

The characteristics of the samples were tested as explained in the "(D) Characteristics Evaluation Test".

All of the samples were found to be an n-type because all of the Seebeck coefficients of the samples exhibited negative values.

The dimensionless figures of merit ZT were calculated by the measured electrical resistivity and thermal conductivities at 800 degrees C.

The calculated dimensionless figures of merit ZT are shown in Table 1 and Table 2.

Figure 1:
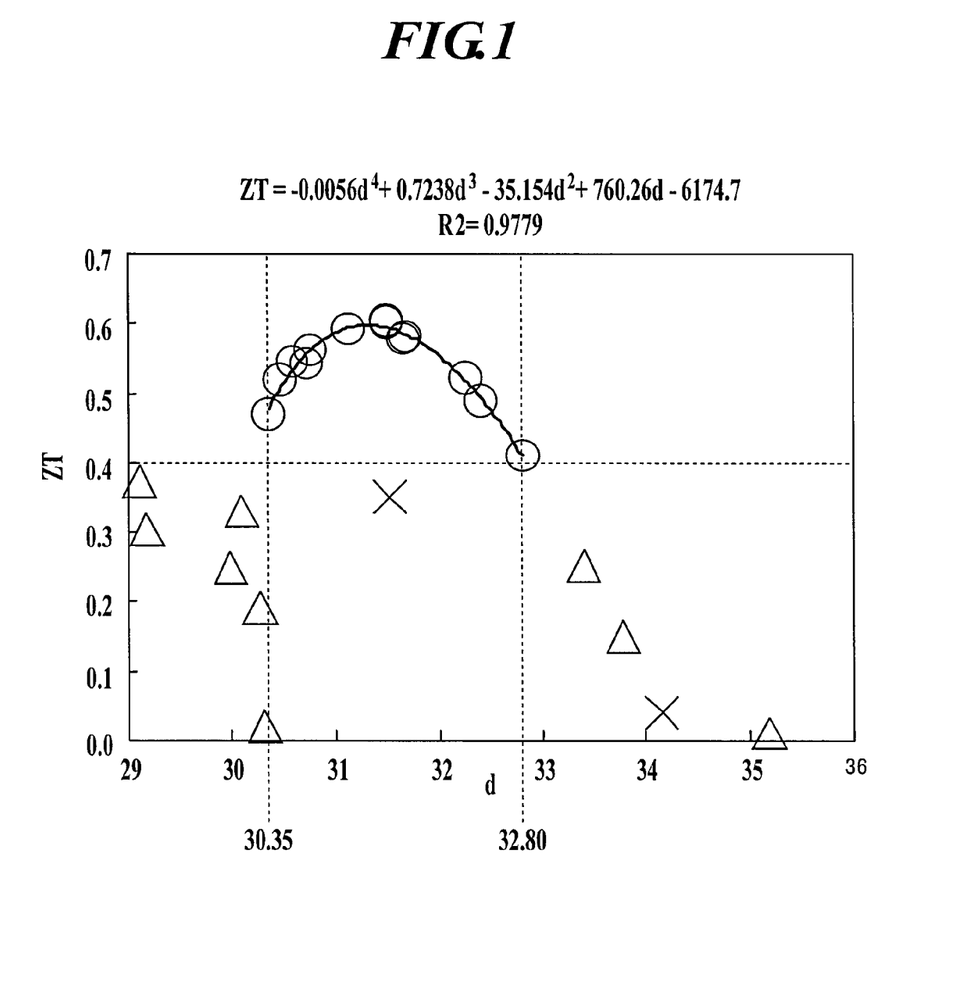
FIG. 1 is a schematic graph showing a relation between a Si composition ratio (d) and dimensionless figure of merit (ZT) at 800 degrees C. of samples of examples 1 to 13 and comparative examples 1 to 11.

FIG. 1 shows a relation between the calculated dimensionless figure of merit ZT and a Si composition ratio (d) of each sample.

In FIG. 1, a symbol "○ (circle)" shows examples 1-1 to 1-13, a symbol "Δ (triangle)" shows comparative examples 1-3 to 1-11 and a symbol "x (cross)" shows comparative examples 1-1 and 1-2. The relation between the calculated dimensionless figure of merit ZT and a Si composition ratio (d) of the examples 1-1 to 1-13 is expressed by the following equation.

$$ZT = -0.0056d^4 + 0.7238d^3 - 35.154d^2 + 760.26d - 6174.7$$

TABLE 1

| SAMPLE | MIXING RATIO[g] | | | | COMPOSITION RATIO [a + b + c + d = 54] | | | | ZT | STRONGEST PEAK RATIO |
|---|---|---|---|---|---|---|---|---|---|---|
| | Ba | Ga | Al | Si | a | b | c | d | | |
| EXAMPLE 1-1 | 10.000 | 6.981 | 1.474 | 7.414 | 7.94 | 10.21 | 4.36 | 31.49 | 0.61 | 100 |
| EXAMPLE 1-2 | 10.000 | 6.346 | 1.719 | 7.414 | 7.77 | 9.68 | 5.07 | 31.49 | 0.60 | 100 |
| EXAMPLE 1-3 | 10.000 | 5.712 | 1.965 | 7.414 | 7.93 | 8.04 | 6.92 | 31.11 | 0.59 | 100 |
| EXAMPLE 1-4 | 10.000 | 5.077 | 1.965 | 7.669 | 7.88 | 7.80 | 6.65 | 31.68 | 0.58 | 100 |
| EXAMPLE 1-5 | 10.000 | 7.616 | 1.474 | 7.158 | 7.82 | 10.67 | 3.86 | 31.65 | 0.58 | 100 |
| EXAMPLE 1-6 | 10.000 | 6.346 | 1.474 | 7.669 | 8.08 | 9.69 | 5.47 | 30.76 | 0.56 | 100 |
| EXAMPLE 1-7 | 10.000 | 10.154 | 0.982 | 6.647 | 7.85 | 12.87 | 2.69 | 30.59 | 0.55 | 100 |
| EXAMPLE 1-8 | 10.000 | 10.154 | 0.000 | 7.669 | 7.80 | 15.21 | 0.28 | 30.72 | 0.54 | 100 |
| EXAMPLE 1-9 | 10.000 | 6.981 | 1.228 | 7.669 | 8.16 | 10.63 | 4.74 | 30.47 | 0.52 | 100 |
| EXAMPLE 1-10 | 10.000 | 6.981 | 1.474 | 7.414 | 7.77 | 10.09 | 3.89 | 32.26 | 0.52 | 100 |
| EXAMPLE 1-11 | 10.000 | 5.077 | 1.965 | 7.669 | 7.93 | 7.91 | 5.75 | 32.41 | 0.49 | 100 |
| EXAMPLE 1-12 | 10.000 | 6.346 | 1.351 | 7.797 | 7.80 | 10.47 | 5.38 | 30.35 | 0.47 | 100 |
| EXAMPLE 1-13 | 10.000 | 4.760 | 1.842 | 7.925 | 7.88 | 7.47 | 5.84 | 32.80 | 0.41 | 100 |

TABLE 2

| SAMPLE | MIXING RATIO[g] | | | | COMPOSITION RATIO [a + b + c + d = 54] | | | | ZT | STRONGEST PEAK RATIO |
|---|---|---|---|---|---|---|---|---|---|---|
| | Ba | Ga | Al | Si | a | b | c | d | | |
| COMPARATIVE EXAMPLE 1-1 | 10.000 | 10.154 | 0.000 | 7.669 | 7.72 | 14.77 | 0.00 | 31.52 | 0.35 | 100 |
| COMPARATIVE EXAMPLE 1-2 | 10.000 | 0.000 | 2.947 | 8.692 | 8.01 | 0.00 | 11.84 | 34.15 | 0.04 | 100 |
| COMPARATIVE EXAMPLE 1-3 | 10.000 | 10.154 | 1.228 | 6.391 | 8.04 | 12.80 | 4.03 | 29.12 | 0.37 | 94 |
| COMPARATIVE EXAMPLE 1-4 | 10.000 | 10.154 | 0.246 | 7.414 | 7.80 | 15.21 | 0.89 | 30.10 | 0.33 | 93 |
| COMPARATIVE EXAMPLE 1-5 | 10.000 | 10.154 | 1.474 | 6.135 | 8.01 | 11.93 | 4.89 | 29.17 | 0.30 | 90 |
| COMPARATIVE EXAMPLE 1-6 | 10.000 | 4.443 | 1.719 | 8.181 | 7.84 | 6.84 | 5.93 | 33.40 | 0.25 | 100 |
| COMPARATIVE EXAMPLE 1-7 | 10.000 | 10.154 | 0.737 | 6.902 | 7.90 | 13.84 | 2.29 | 29.98 | 0.25 | 92 |
| COMPARATIVE EXAMPLE 1-8 | 10.000 | 10.154 | 1.719 | 5.880 | 7.88 | 11.08 | 4.76 | 30.28 | 0.19 | 86 |
| COMPARATIVE EXAMPLE 1-9 | 10.000 | 2.221 | 2.333 | 8.436 | 7.92 | 3.52 | 8.78 | 33.77 | 0.15 | 100 |
| COMPARATIVE EXAMPLE 1-10 | 10.000 | 10.154 | 4.912 | 2.556 | 8.26 | 5.95 | 9.47 | 30.32 | 0.02 | 27 |
| COMPARATIVE EXAMPLE 1-11 | 10.000 | 3.808 | 1.474 | 8.692 | 7.74 | 6.18 | 4.90 | 35.19 | 0.01 | 100 |

(3) Conclusion

As can be seen by Table 1, Table 2 and FIG. 1, when the composition ratio d of Si in the $Ba_aGa_bAl_cSi_d$ is in the range of $30.35 \leq d \leq 32.80$, the ZT value becomes 0.4 or more and it is desirable for a thermoelectric element.

The composition ratios a, b and c of Ba, Ga and Al other than Si are to be $7.77 \leq a \leq 8.16$, $7.47 \leq b \leq 15.21$ and $0.28 \leq c \leq 6.92$, respectively, and the value of ZT hardly depends on the composition ratios within the ranges.

As a conclusion, the specific composition ratio of $Ba_aGa_bAl_cSi_d$ (where $7.77 \leq a \leq 8.16$, $7.47 \leq b \leq 15.21$, $0.28 \leq c \leq 0.92$, $30.35 \leq d \leq 32.80$, and $a+b+c+d=54$) is useful for an n-type thermoelectric element having a ZT value of 0.4 or more at a high temperature range such as 800 degrees C.

Example 2

(1) Sample Preparation

Raw materials mixture was prepared by weighing and mixing of high purity Ba which the degree of purity is 2N or more, high purity Al and Ga both of which the degree of purity is 3N or more and high purity Si which the degree of purity is 3N or more in a mixing ratio shown in Tables 3 and 4.

The powder was melted by arc melting in one minute by passing a current of 300 A on a water-cooled copper hearth under Argon atmosphere and then the ingot was turned upside down and melted again by arc melting for unifying the materials. After repeating the process in five times, the molten materials mixture was cooled down to the room temperature on the water-cooled copper hearth to obtain an ingot containing clathrate compounds.

After that, the ingot was annealed in 6 hours at 900 degrees C. under Argon atmosphere so as to increase uniformity of the ingot.

The obtained ingot was ground using a planetary ball mill made of agate to obtain fine powder. A grain size of the powder was adjusted using a test sieve based on ISO3310-1 standards supplied by Retsch and a sieve shaker AS200 digit supplied by Retsch so as to make the average grain diameter in the range of 75 μm or small.

The obtained powder for sintering was sintered in five minutes at 900 degrees C. using a spark plasma sintering method (SPS). The pressure was 60 MPa. The mixing ratio and the composition ratio of the obtained sintered samples (comparative examples 2-1 to 2-5 and examples 2-1 to 2-25) are shown in Table 3 and Table 4.

The samples were analyzed by the X-ray diffraction explained in the "(C) Confirmation of Production of Clathrate Compound" and tested as explained in the "(D) Characteristics Evaluation Test".

The calculated results are shown in Table 5 and Table 6.

The result of the comparative example 2-1 (strongest peak ratio is 100%) is shown in FIGS. 2 and 3 and the result of the example 2-4 (strongest peak ratio is 95%) is shown in FIG. 4.

(2.3) Characteristics Evaluation

The characteristics of the samples were tested as explained in "(D) Characteristics Evaluation Test".

TABLE 3

| SAMPLE | MIXING RATIO[g] | | | | COMPOSITION RATIO [a + b + c + d = 54] | | | |
|---|---|---|---|---|---|---|---|---|
| | Ba | Ga | Al | Si | a | b | c | d |
| COMPARATIVE EXAMPLE 2-1 | 10.000 | 6.981 | 1.474 | 7.414 | 7.94 | 10.21 | 4.36 | 31.49 |
| COMPARATIVE EXAMPLE 2-2 | 10.000 | 5.712 | 1.965 | 7.414 | 7.93 | 8.04 | 6.92 | 31.11 |
| COMPARATIVE EXAMPLE 2-3 | 10.000 | 6.346 | 1.474 | 7.669 | 8.08 | 9.69 | 5.47 | 30.76 |
| COMPARATIVE EXAMPLE 2-4 | 10.000 | 6.981 | 1.228 | 7.669 | 8.16 | 10.63 | 4.74 | 30.47 |
| COMPARATIVE EXAMPLE 2-5 | 10.000 | 6.346 | 1.351 | 7.797 | 7.80 | 10.47 | 5.38 | 30.35 |
| EXAMPLE 2-1 | 10.600 | 8.181 | 1.474 | 7.414 | 7.89 | 10.23 | 4.39 | 31.49 |
| EXAMPLE 2-2 | 10.800 | 8.581 | 1.474 | 7.414 | 7.92 | 10.15 | 4.41 | 31.52 |
| EXAMPLE 2-3 | 11.000 | 8.981 | 1.474 | 7.414 | 7.99 | 10.21 | 4.36 | 31.44 |
| EXAMPLE 2-4 | 10.600 | 6.912 | 1.965 | 7.414 | 7.98 | 8.06 | 6.84 | 31.12 |
| EXAMPLE 2-5 | 10.800 | 7.312 | 1.965 | 7.414 | 7.94 | 8.10 | 6.79 | 31.17 |
| EXAMPLE 2-6 | 11.000 | 7.712 | 1.965 | 7.414 | 7.85 | 8.13 | 6.91 | 31.11 |
| EXAMPLE 2-7 | 10.600 | 7.546 | 1.474 | 7.669 | 8.02 | 9.81 | 5.40 | 30.77 |
| EXAMPLE 2-8 | 10.800 | 7.946 | 1.474 | 7.669 | 8.00 | 9.88 | 5.39 | 30.73 |
| EXAMPLE 2-9 | 11.000 | 8.346 | 1.474 | 7.669 | 8.10 | 9.48 | 5.50 | 30.92 |
| EXAMPLE 2-10 | 10.800 | 8.581 | 1.228 | 7.669 | 8.10 | 10.68 | 4.81 | 30.41 |

TABLE 4

| SAMPLE | MIXING RATIO[g] | | | | COMPOSITION RATIO [a + b + c + d = 54] | | | |
|---|---|---|---|---|---|---|---|---|
| | Ba | Ga | Al | Si | a | b | c | d |
| EXAMPLE 2-11 | 11.000 | 8.981 | 1.228 | 7.669 | 8.09 | 10.45 | 4.90 | 30.56 |
| EXAMPLE 2-12 | 10.600 | 7.546 | 1.351 | 7.797 | 7.94 | 10.55 | 5.20 | 30.31 |
| EXAMPLE 2-13 | 10.800 | 7.946 | 1.351 | 7.797 | 7.99 | 10.32 | 5.32 | 30.37 |
| EXAMPLE 2-14 | 11.000 | 8.346 | 1.351 | 7.797 | 8.01 | 10.39 | 5.22 | 30.38 |
| EXAMPLE 2-15 | 10.200 | 7.381 | 1.474 | 7.414 | 7.93 | 10.15 | 4.38 | 31.54 |
| EXAMPLE 2-16 | 10.400 | 7.781 | 1.474 | 7.414 | 8.01 | 10.22 | 4.40 | 31.37 |
| EXAMPLE 2-17 | 10.200 | 6.112 | 1.965 | 7.414 | 8.11 | 8.01 | 6.82 | 31.06 |
| EXAMPLE 2-18 | 10.400 | 6.512 | 1.965 | 7.414 | 8.02 | 7.91 | 6.95 | 31.12 |
| EXAMPLE 2-19 | 10.200 | 6.746 | 1.474 | 7.669 | 7.94 | 9.63 | 5.44 | 30.99 |
| EXAMPLE 2-20 | 10.400 | 7.146 | 1.474 | 7.669 | 7.91 | 9.55 | 5.51 | 31.03 |
| EXAMPLE 2-21 | 10.200 | 7.381 | 1.228 | 7.669 | 8.05 | 10.74 | 4.62 | 30.59 |
| EXAMPLE 2-22 | 10.400 | 7.781 | 1.228 | 7.669 | 8.11 | 10.59 | 4.81 | 30.49 |
| EXAMPLE 2-23 | 10.600 | 8.181 | 1.228 | 7.669 | 7.94 | 10.65 | 4.77 | 30.64 |
| EXAMPLE 2-24 | 10.200 | 6.746 | 1.351 | 7.797 | 7.90 | 10.42 | 5.36 | 30.32 |
| EXAMPLE 2-25 | 10.400 | 7.146 | 1.351 | 7.797 | 8.00 | 10.52 | 5.35 | 30.13 |

(2) Sample Evaluation (2.1) Composition Analysis

As can be seen by the results of the composition analysis in Tables 3 and 4, it was confirmed that compounds having a chemical composition of $Ba_aGa_bAl_cSi_d$ (where $7.8 \leq a \leq 8.16$, $7.91 \leq b \leq 10.74$, $4.3 \leq c \leq 6.95$, $30.13 \leq d \leq 31.54$, and $a+b+c+d=54$) were obtained.

(2.2) X-ray Diffraction Analysis

The obtained samples were analyzed by the powder X-ray diffraction.

The strongest peak ratios were calculated by the equation (2) based on the results of the powder X-ray diffraction.

All of the samples were found to be an n-type because all of the Seebeck coefficients of the samples exhibited negative values.

The dimensionless figures of merit ZT were calculated by the measured electrical resistivity and thermal conductivities. In addition, samples having the constant composition of the clathrate phase and varying strongest peak ratios were prepared by adjusting mixing ratios as shown in Table 3 and Table 4, and a rate of change of the ZT value was calculated. The calculation results are shown in Table 5 and Table 6.

Figure 6:
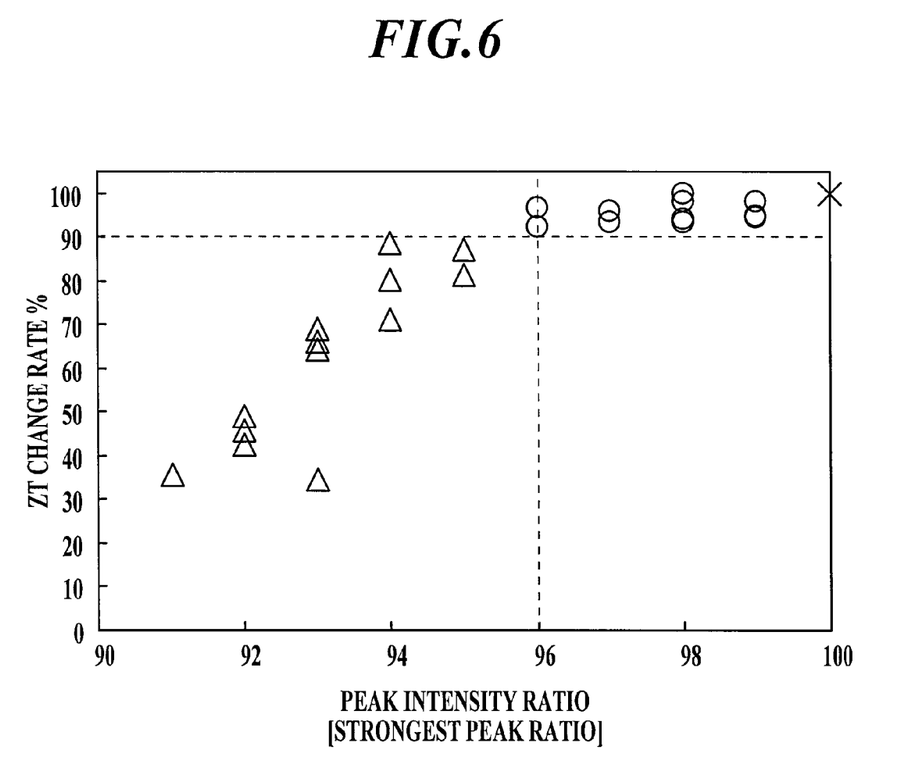
FIG. 6 is a schematic graph showing a relation between a peak strength ratio and a rate of change of ZT of samples according to examples 1 to 11, 12 to 25 and comparative examples 1 to 5.

FIG. 6 is a plot of a relation between the strongest peak ratio and the rate of change of the ZT value of the samples.

In FIG. 6, a symbol "x (cross)" shows comparative examples 2-1 to 2-5, a symbol "Δ (triangle)" shows examples 2-1 to 2-14 and a symbol "○ (circle)" shows examples 2-15 to 2-25.

(2.4) Crack Observation

The samples were observed by an electronic microscope and confirmed whether or not they have a crack. The results are shown in Table 5 and Table 6.

The meaning of "observed" is that the sample was cracked at the end time of sintering and a volume of one piece is less than 90% of the volume before cracking, and the meaning of "not observed" is that even if the sample was cracked, a volume of one piece is 90% or more to the volume before cracking.

TABLE 5

| SAMPLE | STRONGEST PEAK RATIO | ZT | ZT CHANGE RATE % | CRACK | TOTAL EVALUATION |
|---|---|---|---|---|---|
| COMPARATIVE EXAMPLE 2-1 | 100 | 0.61 | 100.00 | OBSERVED | BAD |
| COMPARATIVE EXAMPLE 2-2 | 100 | 0.59 | 100.00 | OBSERVED | BAD |
| COMPARATIVE EXAMPLE 2-3 | 100 | 0.56 | 100.00 | OBSERVED | BAD |
| COMPARATIVE EXAMPLE 2-4 | 100 | 0.52 | 100.00 | OBSERVED | BAD |
| COMPARATIVE EXAMPLE 2-5 | 100 | 0.47 | 100.00 | OBSERVED | BAD |
| EXAMPLE 2-1 | 94 | 0.54 | 88.52 | NOT OBSERVED | FAIR |
| EXAMPLE 2-2 | 93 | 0.42 | 68.85 | NOT OBSERVED | FAIR |
| EXAMPLE 2-3 | 92 | 0.28 | 45.90 | NOT OBSERVED | FAIR |
| EXAMPLE 2-4 | 95 | 0.48 | 81.36 | NOT OBSERVED | FAIR |
| EXAMPLE 2-5 | 93 | 0.39 | 66.10 | NOT OBSERVED | FAIR |
| EXAMPLE 2-6 | 92 | 0.29 | 49.15 | NOT OBSERVED | FAIR |
| EXAMPLE 2-7 | 94 | 0.45 | 80.36 | NOT OBSERVED | FAIR |
| EXAMPLE 2-8 | 93 | 0.36 | 64.29 | NOT OBSERVED | FAIR |
| EXAMPLE 2-9 | 91 | 0.20 | 35.71 | NOT OBSERVED | FAIR |
| EXAMPLE 2-10 | 94 | 0.37 | 71.15 | NOT OBSERVED | FAIR |

TABLE 6

| SAMPLE | STRONGEST PEAK RATIO | ZT | ZT CHANGE RATE % | CRACK | TOTAL EVALUATION |
|---|---|---|---|---|---|
| EXAMPLE 2-11 | 93 | 0.18 | 34.62 | NOT OBSERVED | FAIR |
| EXAMPLE 2-12 | 95 | 0.41 | 87.23 | NOT OBSERVED | FAIR |
| EXAMPLE 2-13 | 93 | 0.31 | 65.96 | NOT OBSERVED | FAIR |
| EXAMPLE 2-14 | 92 | 0.20 | 42.55 | NOT OBSERVED | FAIR |
| EXAMPLE 2-15 | 98 | 0.57 | 93.44 | NOT OBSERVED | GOOD |
| EXAMPLE 2-16 | 96 | 0.59 | 96.72 | NOT OBSERVED | GOOD |
| EXAMPLE 2-17 | 99 | 0.56 | 94.92 | NOT OBSERVED | GOOD |
| EXAMPLE 2-18 | 97 | 0.55 | 93.22 | NOT OBSERVED | GOOD |
| EXAMPLE 2-19 | 99 | 0.53 | 94.64 | NOT OBSERVED | GOOD |
| EXAMPLE 2-20 | 98 | 0.55 | 98.21 | NOT OBSERVED | GOOD |
| EXAMPLE 2-21 | 99 | 0.51 | 98.08 | NOT OBSERVED | GOOD |
| EXAMPLE 2-22 | 98 | 0.49 | 94.23 | NOT OBSERVED | GOOD |
| EXAMPLE 2-23 | 96 | 0.48 | 92.31 | NOT OBSERVED | GOOD |
| EXAMPLE 2-24 | 98 | 0.47 | 100.00 | NOT OBSERVED | GOOD |
| EXAMPLE 2-25 | 97 | 0.45 | 95.74 | NOT OBSERVED | GOOD |

(3) Conclusion

As can be seen in Table 5 and Table 6, by comparing the comparative examples 2-1 to 2-5 and the examples 2-1 to 2-25, a crack was not observed when the strongest peak ratio is less than 100%.

It is beneficial to keep the strongest peak ratio being less than 100% by forming a second phase in a thermoelectric material for preventing an occurrence of a crack of the clathrate compound.

In addition, as shown in FIG. 6, when the strongest peak ratio is within a range of 96 to 99%, the rate of change of the ZT value becomes 90% or more. Thus it turned out to be beneficial to keep the strongest peak ratio in the range for keeping the rate of change of the ZT value small.

Example 3

(1) Sample Preparation

Raw materials mixture was prepared by weighing and mixing of high purity Ba which the degree of purity is 2N or more, high purity Al and Ga both of which the degree of purity is 3N or more and high purity Si which the degree of purity is 3N or more in a mixing ratio shown in Table 7.

TABLE 7

| | MIXING WEIGHT [g] | | | |
|---|---|---|---|---|
| SAMPLE | Ba | Ga | Al | Si |
| EXAMPLE 3-1 | 5.000 | 5.077 | 0.614 | 3.196 |
| EXAMPLE 3-2 | | 4.760 | 0.123 | 3.835 |
| COMPARATIVE EXAMPLE 3-1 | | 5.077 | — | 3.835 |
| COMPARATIVE EXAMPLE 3-2 | | 3.808 | 0.491 | 3.835 |
| COMPARATIVE EXAMPLE 3-3 | | 5.077 | 2.456 | 1.278 |
| COMPARATIVE EXAMPLE 3-4 | | — | 1.965 | 3.835 |

The powder was melted by arc melting in one minute by passing a current of 300 A on a water-cooled copper hearth under Argon atmosphere and then the ingot was turned upside down and melted again by arc melting for unifying the raw materials. After repeating the process in five times, the molten materials mixture was cooled down to the room temperature on the water-cooled copper hearth to obtain an ingot containing clathrate compounds.

After that, the ingot was annealed in 6 hours at 900 degrees C. under Argon atmosphere so as to increase uniformity of the ingot.

The obtained ingot was ground using a planetary ball mill made of agate to obtain fine powder. A grain size of the powder was adjusted using a test sieve based on ISO3310-1 standards supplied by Retsch and a sieve shaker AS200 digit supplied by Retsch so as to make the average grain diameter in the range of 75 μm or small.

The obtained powder for sintering was sintered in five minutes at 900 degrees C. using a spark plasma sintering method (SPS). The pressure was 60 MPa.

The six samples (examples 3-1 to 3-2 and comparative examples 3-1 to 3-4) obtained as above were analyzed by the X-ray diffraction explained in the "(C) Confirmation of Production of Clathrate Compound" and tested as explained in the "(D) Characteristics Evaluation Test".

(2) Sample Evaluation (2.1) Composition Analysis

The result of the composition analysis is shown in Table 8.

It can be confirmed from Table 8 that a compound having the desired composition represented as $Ba_zGa_{y-x}Al_xSi_{46-y}$ (where $7 \leq z \leq 8$, $15 \leq y \leq 17$, and $0 < x < y$) was obtained by the examples 3-1 and 3-2.

TABLE 8

| SAMPLE | COMPOSITION ANALYSIS RESULT[%] | | | | STRONGEST PEAK RATIO |
|---|---|---|---|---|---|
| | Ba | Ga | Al | Si | |
| EXAMPLE 3-1 | 15.143 | 21.232 | 7.345 | 56.282 | 100 |
| EXAMPLE 3-2 | 14.980 | 24.926 | 1.749 | 58.346 | 100 |
| COMPARATIVE EXAMPLE 3-1 | 14.203 | 27.376 | — | 58.422 | 81 |
| COMPARATIVE EXAMPLE 3-2 | 14.832 | 20.754 | 7.113 | 57.302 | 84 |
| COMPARATIVE EXAMPLE 3-3 | 15.296 | 10.936 | 17.539 | 56.230 | 58 |
| COMPARATIVE EXAMPLE 3-4 | 14.826 | — | 21.785 | 63.390 | 100 |

(2.2) X-ray Diffraction Analysis

Figure 7:
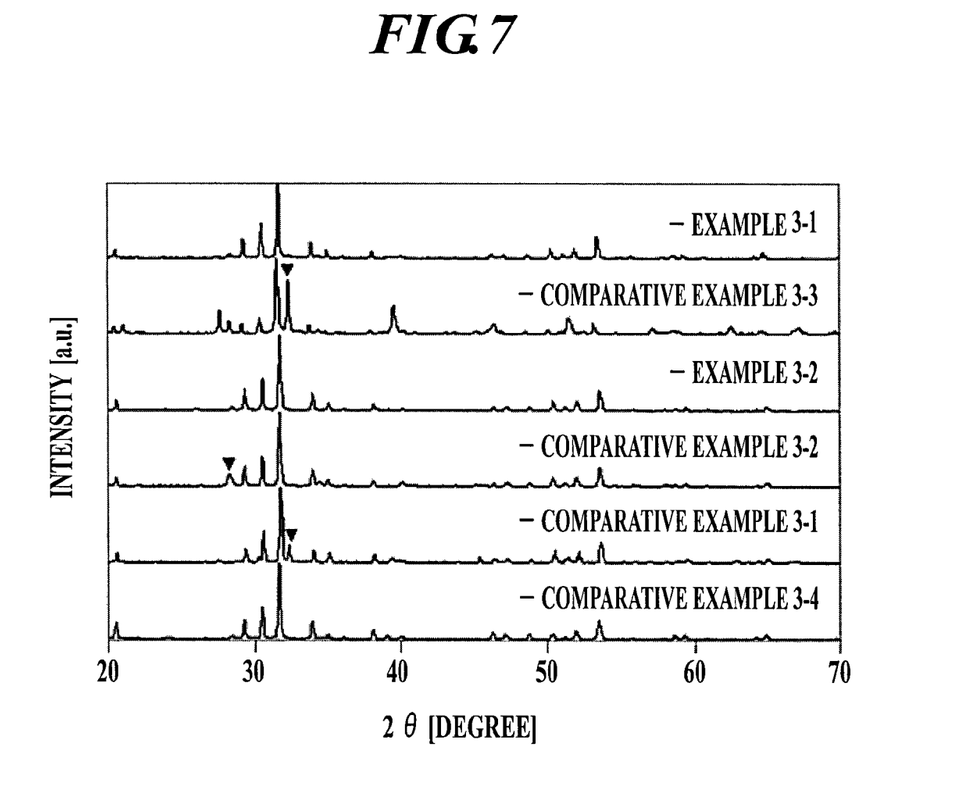
FIG. 7 is a schematic graph showing a powder X-ray diffraction of samples of examples 1, 2 and comparative examples 1 to 4.

The samples of the examples 3-1 and 3-2 and the comparative examples 3-1 to 3-4 were analyzed by the powder X-ray diffraction. The results are shown in FIG. 7 and the strongest peak ratios were calculated by the equation (2) based on the results of the X-ray diffraction. In FIG. 7, a symbol of solid (black) inverted triangle mainly indicates a peak of impurities.

The samples of the examples 3-1 and 3-2 and the comparative example 3-4 showed a low peak of impurities and the comparative examples 3-1 to 3-3 showed a relatively high peak of impurities, as shown in FIG. 7.

(2.3) Characteristics Evaluation

The characteristics of the samples of the examples 3-1 and 3-2 and the comparative example 3-1 to 3-4 were tested as explained in "(D) Characteristics Evaluation Test".

All of the samples were found to be an n-type because all of the Seebeck coefficients of the samples exhibited negative values.

Figure 8:
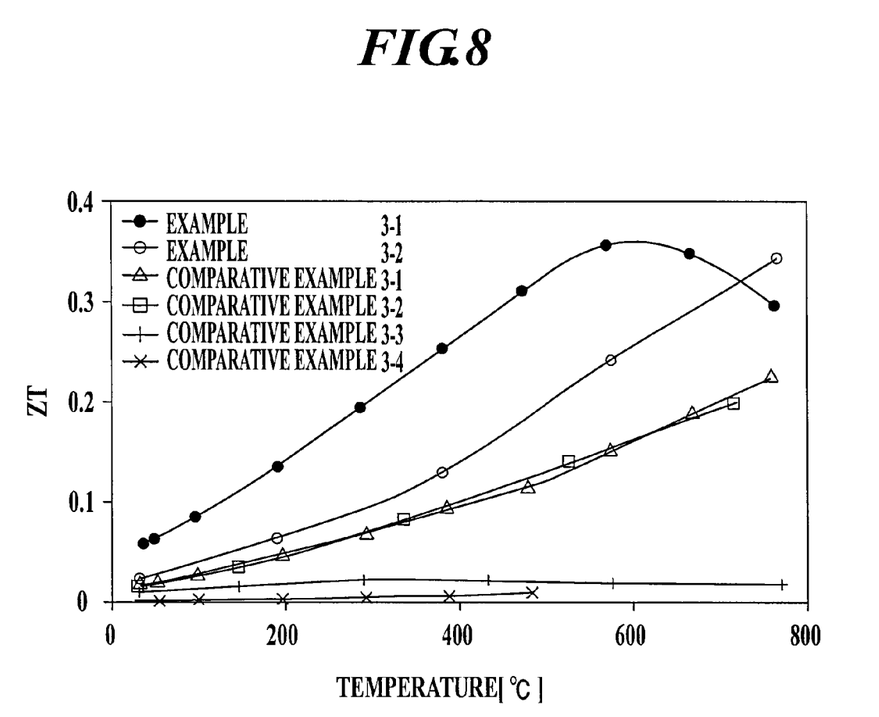
FIG. 8 is a schematic graph showing a relation between temperature and a dimensionless figure of merit (ZT) of samples of examples 1 and 2 and comparative examples 1 to 4.

The dimensionless figures of merit ZT were calculated by the measured electrical resistivity and thermal conductivities. The ZT values were plotted against temperature and the result is shown in FIG. 8. It can be seen by the graph that the samples of the examples 3-1 and 3-2 have higher ZT values at the temperature range of 200 to 800 degrees C.

(3) Conclusion

It was proved that the specific composition represented as $Ba_zGa_{y-x}Al_xSi_{46-y}$ (where $7 \leq z \leq 8$, $15 \leq y \leq 17$, and $0 < x < y$) is useful to obtain an n-type thermoelectric material having a ZT value of 0.2 or more at the temperature range of 200 to 800 degrees C.

INDUSTRIAL APPLICABILITY

The clathrate compound according to an exemplary embodiment of the present invention is applicable to a thermoelectric element that can convert heat energy into electric energy.

The present U.S. application claims a priority under the Paris Convention of Japanese Patent Application No. 2010-155353 filed on Jul. 8, 2010, No. 2011-069472 filed on Mar. 28, 2011 and No. 2011-069475 filed on Mar. 28, 2011, the disclosures of which are incorporated by reference in its entirety.

What is claimed is:

1. A clathrate compound represented by a following chemical formula:

$Ba_aGa_bAl_cSi_d$

(wherein $7.77 \leq a \leq 8.16$, $7.47 \leq b \leq 15.21$, $0.28 \leq c \leq 6.92$, $30.35 \leq d \leq 32.80$, and $a+b+c+d=54$).

2. A thermoelectric material of an n-type, comprising a clathrate compound represented by a following chemical formula:

$Ba_aGa_bAl_cSi_d$ (wherein $7.77 \leq a \leq 8.16$, $7.47 \leq b \leq 15.21$, $0.28 \leq c \leq 6.92$, $30.35 \leq d \leq 32.80$, and $a+b+c+d=54$).

3. A thermoelectric material, comprising mainly a clathrate compound represented by a following chemical formula:

$Ba_aGa_bAl_cSi_d$ (wherein $7.8 \leq a \leq 8.16$, $7.91 \leq b \leq 10.74$, $4.36 \leq c \leq 6.95$, $30.13 \leq d \leq 31.54$, and $a+b+c+d=54$), wherein;

a "strongest peak ratio" defined by a following equation is less than 100%:

"strongest peak ratio"=IHS/(IHS+IA)×100(%)

where "IHS" is a strongest peak of a Si clathrate phase by an X-Ray diffraction analysis and "IA" is a strongest peak of a compound represented by $BaGa_{4-Y}(Al, Si)_Y$ ($0 \leq Y \leq 4$) by the X-Ray diffraction analysis.

4. A method for producing the thermoelectric material according to claim 2, comprising:

preparing a clathrate compound having a predetermined composition by mixing raw materials of Ba, Ga, Al and Si, melting the mixed raw materials and solidifying the melted raw materials, grinding the clathrate compound into a fine powder, and sintering the fine powder.

5. The method for producing the thermoelectric material according to claim 4, wherein the sintering comprising:

heating the fine powder to 600 to 900 degrees C.,
keeping the heated fine powder at the sintering temperature for 1 to 10 minutes, and
cooling the sintered fine powder to a temperature before heating, wherein;
the fine powder is kept under a pressurized atmosphere of 40 to 80 MPa at the heating of the fine powder and keeping of the temperature, and
the pressurized atmosphere is released at the cooling of the sintered fine powder.

* * * * *